XR 2,994,791 OSS REFERENCE SEARCH ROOM

Aug. 1, 1961 TOSHIO SHINADA ET AL 2,994,791

ELECTRODE OF A QUARTZ OSCILLATOR

Filed May 26, 1958 2 Sheets-Sheet 1

INVENTORS
TOSHIO SHINADA
MICHITAKA YAMAGUCHI.
BY
[signature]
ATTORNEY

Aug. 1, 1961 TOSHIO SHINADA ET AL 2,994,791

ELECTRODE OF A QUARTZ OSCILLATOR

Filed May 26, 1958 2 Sheets-Sheet 2

INVENTORS
TOSHIO SHINADA
MICHITAKA YAMAGUCHI
BY

ATTORNEY

United States Patent Office
2,994,791
Patented Aug. 1, 1961

2,994,791

ELECTRODE OF A QUARTZ OSCILLATOR

Toshio Shinada, 1,399 Iruma-machi, Chofu-shi, and Michitaka Yamaguchi, 2,132, 1-chome, Egota, Nakano-ku, both of Tokyo, Japan Filed May 26, 1958, Ser. No. 737,828
Claims priority, application Japan May 27, 1957
3 Claims. (Cl. 310—9.7)

The present invention relates to an electrode for a quartz oscillator of the type having shear plane harmonic mode of vibration.

The object of this invention is to provide an electrode system for a quartz oscillator characterized by efficient collecting of the surface charges by using electrodes suitable for the vibration mode of the quartz oscillator, and accordingly by its low equivalent resonance-impedance.

A quartz oscillator for a medium wave band has a tendency to be of a high impedance when operating in the shear plane mode of vibration, because then the dimension of the contour of the quartz naturally becomes small, and in the mode of thickness vibration, not only the vibration mode of the oscillator will be a combination of thickness and contour vibration, because then the oscillator should be thick, but also cannot be avoided inconvenience of an extremely large dimension required for the quartz.

However, in the mode of plane-shear vibration of harmonic, the quartz to be used for a medium wave band can be comparatively handy in dimension, easy to be manufactured and satisfactory in function. On the other hand, the vibration of harmonic produces both positive and negative charges on the same face of the quartz due to the phase difference of the internal strains of the quartz, so that some of the charges on the surface are mutually cancelled out to result in an increase of the resonance-impedance.

Figure 1:
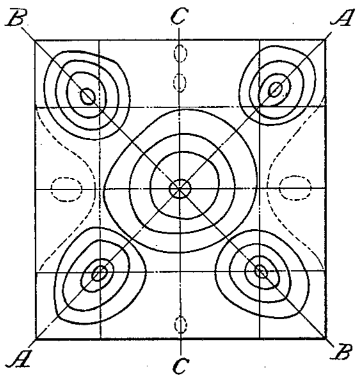
FIG. 1 is a diagram showing the distributions of charge density on the front vibrating face of a quartz oscillator.
Figure 2:
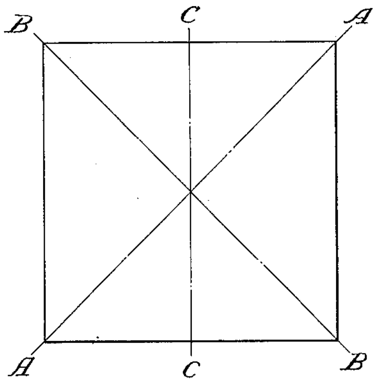
FIG. 2 is a front view of a quartz oscillator.
Figure 3:
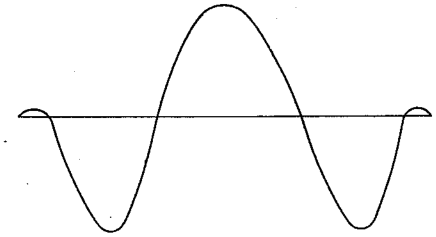
FIGS. 3, 4 and 5 are charts showing density distribution curves of the surface charges in the directions of lines A—A, B—B, and C—C in FIG. 2, respectively.
Figure 4:
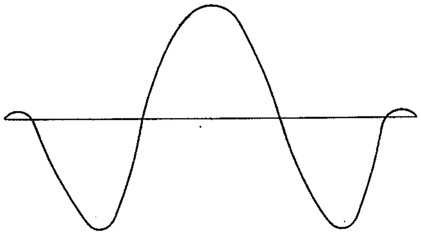
Figure 5:
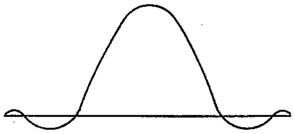

In FIG. 1 showing the experimental result, the vertical, horizontal and crossing axes are coordinates assumed for convenience on the vibrating face of the quartz oscillator, the solid curved lines indicate the loci of the positively or negatively equi-charged points which are denoted by positive or negative numbers proportional to the charge densities, respectively, and the dotted lines show the loci of zero charge. As understood by this experimental result, the sign of surface charge alters in reference to the position on the vibrating face of the quartz. In other words, the central part of the vibrating face is charged positively, whereas the parts near the corners are charged negatively. This will be clearer by referring to FIGS. 2, 3, 4 and 5. The density distributions of the surface charges in the directions of chain lines A—A, B—B and C—C in FIG. 2 are shown by curves in FIGS. 3, 4 and 5, respectively, in each of which the vertical axis (not shown) expresses the electric current proportional to the density of surface charge and the horizontal axis indicates the relative position in the direction of lines A—A, B—B, or C—C in FIG. 2, the upper and lower sides in reference to the horizontal axis corresponding to the positive and negative sides, respectively.

Figures 6, 7, 8, 9:
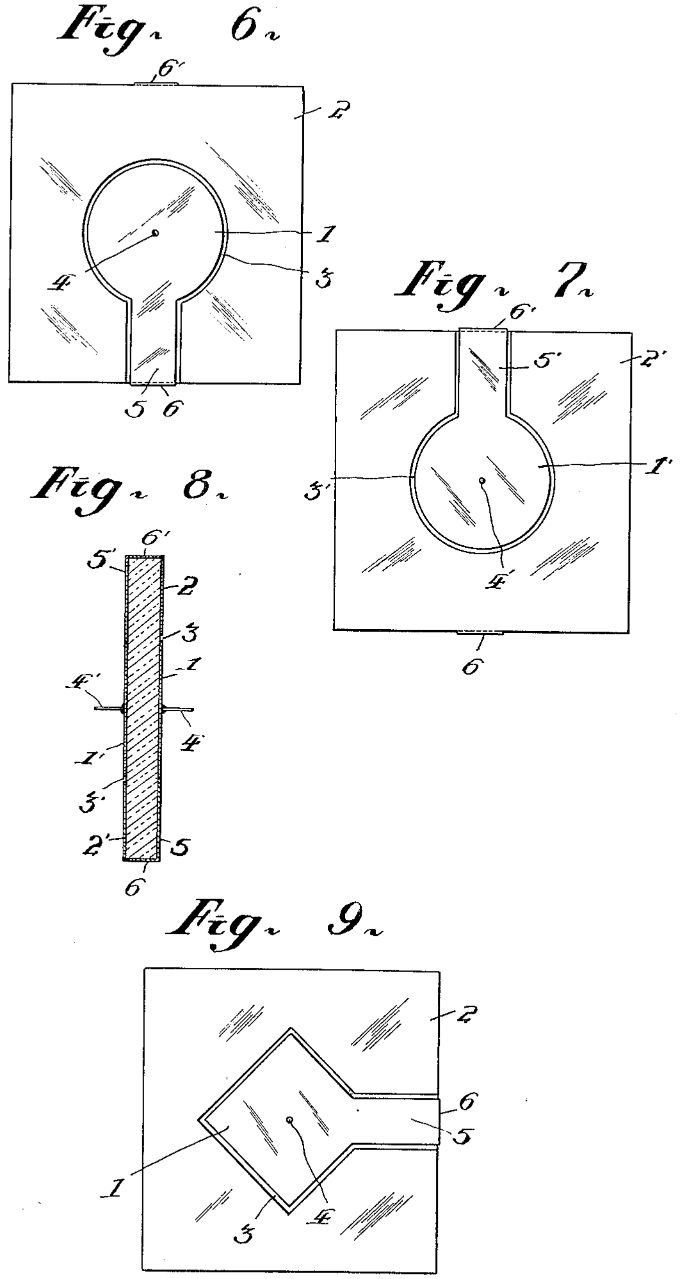
FIG. 6 is a front view of an embodiment of the present invention.
FIG. 7 is a back view of the same.
FIG. 8 is a sectional side view of the arrangement of the electrodes shown in FIG. 6.
FIG. 9 is a front view showing a modification of the present invention.

In FIG. 6 showing an embodiment of the present invention in which the shear plane vibration of a square quartz is in use on the basis of the aforementioned characteristic of charge density, 1 is a main part of a central electrode, which is circular in shape, 2 is a surrounding electrode with similar circular opening, both of which can be prepared by metallic spattering and the like, and 3 is an electrically non-conductive separator between the both electrodes 1 and 2. The central electrode including the main part 1 and a lead part 5 is circular in shape, and a lead-wire mounting 4 is provided at the center of the main part 1 of the central electrode. The leading part 5 which is made as thin as possible is electrically connected with the symmetrical surrounding electrode 2' on the reverse face of the quartz through a spattered metallic film 6 and the like across the side of the quartz, as shown in FIG. 7 and FIG. 8. On the other hand, the leading part of the symmetrical, circular central electrode 1' on the reverse face is electrically connected with the surrounding electrode 2 of the front face through metallic film 6' in the same way as the above across the side of the quartz, as shown in FIG. 7. In the reverse face, 3' is the non-conductive zone between the central electrode 1' and the surrounding electrode 2' and 4' is the lead-wire mounting.

Thus, on each face of the quartz the positively and negatively charged parts are separated from one another, so that the charges of the same sign, whether these are positive or negative, may be collected separately and efficiently. In addition to it, both the electric drawing-out of the charges and the mechanical holding of the quartz oscillator can be done at the centers of the central electrodes of both faces which correspond to the vibrating nodes. Consequently the resonance-impedance can be reduced considerably. According to the experimental result, it has been proved to be reduced to 40 to 60 percent of the case where a non-divided electrode is used.

As seen in FIG. 9 showing a modification of the present invention, the main part of the central electrode 1 may be square in shape.

It is to be understood that the invention is capable of various uses and that changes and adaptions may be made therein as will be apparent to a person skilled in the art.

What I claim is:

1. An electrode system employing a quartz oscillator, said system comprising a quartz oscillator in square form and having a shear plane harmonic mode of vibration, a central electrode having a lead wire mounting at the center thereof and surrounding electrode on each face of the quartz both of which, on the same face of the quartz, are electrically separated from one another and have relatively opposite-signed charges, the central electrode of the front face being electrically connected with the surrounding electrode of the reverse face, and the central electrode of the reverse face being electrically connected with the surrounding electrode of the front face of the quartz so that the surface charges of the same sign may be efficiently collected with a low resonance-impedance.

2. An electrode system as set forth in claim 1 in which said central electrodes are circular in cross section.

3. An electrode system as set forth in claim 1 in which said central electrodes are square in cross section.

References Cited in the file of this patent

UNITED STATES PATENTS

| | | |
|---|---|---|
| 1,930,536 | Piersol | Oct. 17, 1933 |
| 2,248,057 | Bond | July 8, 1941 |
| 2,385,896 | Beckerath | Oct. 2, 1945 |

(Other references on following page)

UNITED STATES PATENTS

| | | |
|---|---|---|
| 2,595,037 | Wolfskill | Apr. 29, 1952 |
| 2,635,199 | Wolfskill | Apr. 14, 1953 |
| 2,648,785 | Tournier | Aug. 11, 1953 |
| 2,656,473 | Warner | Oct. 20, 1953 |
| 2,771,561 | Fuller | Nov. 20, 1956 |

OTHER REFERENCES

Cady: Piezolectricity, copyright 1946, McGraw-Hill Book Company, New York, pages 284–286.